(12) United States Patent
Matschl et al.

(10) Patent No.: US 8,742,760 B2
(45) Date of Patent: Jun. 3, 2014

(54) TRANSMIT COIL ARRANGEMENT FOR A MAGNETIC RESONANCE DEVICE AND MAGNETIC RESONANCE DEVICE

(75) Inventors: Volker Matschl, Bamberg (DE); Jürgen Nistler, Erlangen (DE); Sandra Weiβ, Fürth (DE)

(73) Assignee: Siemens Aktiengesellschaft, München (DE)

( * ) Notice: Subject to any disclaimer, the term of this patent is extended or adjusted under 35 U.S.C. 154(b) by 262 days.

(21) Appl. No.: 13/230,621

(22) Filed: Sep. 12, 2011

(65) Prior Publication Data

US 2012/0062232 A1 Mar. 15, 2012

(30) Foreign Application Priority Data

Sep. 14, 2010 (DE) .......................... 10 2010 040 680

(51) Int. Cl.
*G01V 3/00* (2006.01)
(52) U.S. Cl.
USPC .......................................... 324/318; 324/322
(58) Field of Classification Search
USPC .................... 324/300–322; 600/407–445
See application file for complete search history.

(56) References Cited

U.S. PATENT DOCUMENTS

| | | | | |
|---|---|---|---|---|
| 4,712,560 A | * | 12/1987 | Schaefer et al. | 600/413 |
| 5,427,103 A | * | 6/1995 | Fujio et al. | 600/423 |
| 6,556,012 B2 | * | 4/2003 | Yamashita | 324/318 |
| 7,048,716 B1 | * | 5/2006 | Kucharczyk et al. | 604/164.01 |
| 7,071,693 B2 | * | 7/2006 | Yasuhara | 324/319 |
| 7,449,888 B1 | | 11/2008 | Malik et al. | |
| 7,800,368 B2 | * | 9/2010 | Vaughan et al. | 324/318 |
| 7,849,993 B2 | * | 12/2010 | Finkenzeller et al. | 194/206 |
| 2010/0213941 A1 | * | 8/2010 | Driesel et al. | 324/322 |
| 2013/0184566 A1 | * | 7/2013 | Kreischer et al. | 600/422 |

FOREIGN PATENT DOCUMENTS

DE 102 44 172 A1 3/2004
WO WO 2007/109426 A1 9/2007

OTHER PUBLICATIONS

German Office Action dated Jun. 9, 2011 for corresponding German Patent Application No. DE 10 2010 040 680.5 with English translation.
X. Chu et al., "Ultra-low Output Impedance RF Power Amplifier Array," Proc. Intl. Soc. Mag. Reson. Med. 15 (2007): p. 172.

* cited by examiner

*Primary Examiner* — Brij Shrivastav
(74) *Attorney, Agent, or Firm* — Lempia Summerfield Katz LLC

(57) ABSTRACT

A transmit coil arrangement for a magnetic resonance device includes a plurality of individually actuatable conductor loops following one after another in a peripheral direction and a longitudinal direction on a cylinder surface. At least two groups, at a distance from one another in the peripheral direction, of at least two conductor loops following one after the other in the longitudinal direction are provided in the peripheral direction. To decouple the at least two groups, each of the at least two groups is bounded at least in the peripheral direction by at least one screen surface extending essentially in a radial direction and the longitudinal direction.

21 Claims, 4 Drawing Sheets

TRANSMIT COIL ARRANGEMENT FOR A MAGNETIC RESONANCE DEVICE AND MAGNETIC RESONANCE DEVICE

This application claims the benefit of DE 10 2010 040 680.5, filed on Sep. 14, 2010.

BACKGROUND

The present embodiments relate to a transmit coil arrangement for a magnetic resonance device.

When imaging using magnetic resonance devices utilizing a basic field strength greater than or equal to 3 Tesla, for example, interactions of an object being recorded with excitation fields generated by a high-frequency antenna cause the image quality to deteriorate. This is manifested, for example, in a spatial variation of flip angles during a transmit phase or fluctuations in a signal-to-noise ratio during data acquisition (e.g., during receiving). Absorption of the transmit output by the object to be recorded (e.g., specific absorption rate (SAR)) is also more important here, so some imaging sequences are to be adjusted due to the SAR limitation with the result that the quality of these image recordings is reduced.

To resolve both these problems, the standard transmit coils with circular polarization (e.g., birdcage coils) are no longer used. Instead, transmit coil arrangements configured as antenna arrays are used. In conjunction with a multichannel transmit system, the excitation field and the flip angle distribution may be shaped. At the same time, the SAR load for the object to be recorded (e.g., a patient) may also be reduced. This technique, with which an excitation field is generated at the same time using a plurality of conductor loops forming part of the transmit coil arrangement, may be referred to as parallel transmission. Such arrays have been used in the prior art for receive coil arrangements in order to improve the signal-to-noise ratio and reduce recording times.

A problem with such transmit coil arrangements, which include an array of conductor loops, is the coupling occurring between the individual conductor loops (e.g., antenna elements). Adequate decoupling is provided to avoid feedover between the transmit channels and therefore, in some instances, destruction of the transmit channels. For transmit coil arrangements having conductor loops disposed following one after another over the periphery, measures to achieve adequate decoupling are known. Examples are the use of an overlap between adjacent conductor loops or a capacitor in a shared conductor of adjacent conductor loops.

For transmit arrays, in which antenna elements (e.g., conductor loops) follow one after another in a peripheral direction and a longitudinal direction, the methods known from receive coil arrangements fail, as the preamplifier decoupling used in the known methods may not be used with transmit coil arrangements.

Many trials on the subject of more than two conductor loops of a transmit coil arrangement that follow one after another in a longitudinal direction are based on simulation, with the decoupling of the conductor loops playing no role. In a typical transmit coil arrangement, the conductor loops are decoupled by overlap. However, only adjacent conductor loops may be decoupled, as a very powerful disadvantageous coupling of conductor loops positioned diagonally to one another occurs. Decoupling using a shared capacitor also may not be possible, since with the arrangement of at least three conductor loops following one after another in a longitudinal direction, there is no longer a sufficient number of degrees of freedom for the center ring or rings to allow decoupling.

In one approach to a solution, amplifiers with a low output impedance are used. The amplifiers are amplifiers that operate in the manner of an ideal power source and therefore also emit the required current when individual antenna elements are coupled. A countercurrent, for example, is generated. The countercurrent negates the coupling effects. The preamplifier, for example, is to be configured so that the preamplifier manages with the output coupled over, and large dimensions may therefore be required. Such compensation for inadequate decoupling of the conductor loops by increasing amplifier output is disadvantageous, as the outlay for this purpose and the costs required rise excessively so that the use of such a transmit coil arrangement is not practical. An embodiment with amplifiers of low output impedance is described, for example, in the Proceedings of the International Society of Magnetic Resonance in Medicine 2007, Abstract 172 (see also the article "Ultra-low Output Impedance RF Power Amplifier Array" by X. Chu, et al., Proc. Intl. Soc. Mag. Reson. Med. 15 (2007), page 172).

SUMMARY AND DESCRIPTION

The present embodiments may obviate one or more of the drawbacks or limitations in the related art. For example, a transmit coil arrangement that allows more effective decoupling between individual conductor loops may be provided.

In one embodiment of a transmit coil arrangement, each group may be bounded at least in a peripheral direction by at least one screen surface extending, for example, essentially in a radial and a longitudinal direction to decouple the groups.

Simple distancing of the groups in a peripheral direction (e.g., 10 cm) may not be sufficient to achieve adequate decoupling. In one embodiment, the design of the transmit coil arrangement may be improved by an additional decoupling measure so that adequate decoupling (e.g., better than 15 decibels between all elements) is achieved. With a transmit coil arrangement, in which conductor loops (antenna elements) follow one after another in the peripheral and the longitudinal direction, that may be used primarily as an integrated whole-body transmit antenna in a magnetic resonance device, a conductor loop array is made up of groups that follow one after another in the peripheral direction. The individual groups are isolated from one another by distance and a screen surface (e.g., a screen wall and/or a closed screen) to such a degree that the desired decoupling is achieved. A group includes conductor loops that are disposed so that the conductor loops follow one after another in the longitudinal direction.

This creates an antenna structure that allows a sufficiently dense arrangement of conductor loops in the longitudinal direction and the peripheral direction. The possibilities for parallel transmission may be utilized optimally to homogenize magnetic fields or flip angles, and the specific absorption rate (SAR) load on a patient may be reduced. Conductor loops that follow one after the other in the longitudinal direction and the peripheral direction has the advantage, compared with systems in which antenna elements only follow one after the other in the peripheral direction (e.g., peripheral direction systems), that homogenization is possible in all directions, as compared to only being achieved in transverse planes in peripheral direction system. A homogenization of volumes is also possible. The specific absorption rate may be monitored/influenced more effectively, and higher acceleration rates are possible with parallel transmit methods (e.g., with TX-Sense). In the TX-Sense procedure, high-frequency impulses and gradient actuation are combined to excite sub-regions of the k space by way of several transmit channels.

When using the transmit coil arrangement of the present embodiments, acceleration may be achieved, for example, in that sub-regions of the k space may be excited more quickly.

Insertion of the advantageous screen surface (e.g., a continuous screen surface) provides that where there is a short distance between the screen surface and the actual conductors of the conductor loops, there may be a reduction in antenna efficiency. The higher output required as a result to generate the same field, however, is more than offset overall for the transmit coil arrangement by the advantages of better decoupling.

In one embodiment, the continuous screen surface may bound the group in the peripheral direction and in the longitudinal direction, extending, for example, essentially perpendicular to the longitudinal direction. This allows a continuous screen surface to be realized. The continuous screen surface forms a screen wall around the group, the screen wall having openings in a radial direction. This may be advantageous with respect to simpler construction and a more stable structure.

The screen surface may have a radial portion facing away from the center of the cylinder and distanced in a radial direction in a defined manner from the conductor loops of the group. In combination with a peripheral, continuous screen wall, the screen surface produces a pot-type cover that also covers the entire group to the outside in a radial direction. The radial portion covering the entire group is at the same distance from the conductor loops at all points. This may be advantageous with respect to tuning the conductor loops. If the transmit coil arrangement is enclosed by a high-frequency screen, which may be disposed, for example, on a gradient coil arrangement, the distance to the high-frequency screen has an influence on the correct tuning of the conductor loops. If there is a radial portion of the screen surface, there is already a screen surface present at a defined distance and extending out in a radial direction, so that the distance to the high-frequency screen is no longer relevant. Alignment after the assembly of all the groups or integration within the high-frequency screen enclosing the transmit coil arrangement is no longer necessary. The groups may be tuned independently in the same way as for the high-frequency screen.

In one embodiment, the screen surface may have an elongation of 2 to 3 cm in a radial direction. During trials in the context of the present embodiments, it has been proven, for example, that with a distance of 10 cm between the groups in a peripheral direction, adequate decoupling is possible over such a screen surface height.

The screen surface may, for example, be formed by a film (e.g., a copper film) and/or have a thickness of 7 to 12 μm. While the screen surface may be formed by any conducting material (e.g., metal) to satisfy the screen function, copper film has proven to be advantageous with respect to properties and processing. The film may have a thickness of 7 to 12 μm. The necessary thickness, however, is determined based on the fields that are to be generated and are present. In one embodiment, a copper film 9 μm thick may be used for a basic magnetic field of 3 Tesla.

Where a thin layer is used as the screen surface (e.g., in the case of a film), the screen surface may be provided on a support material that has low permittivity (e.g., less than 3). The support material, which may, for example, be preshaped so that the support material has a surface that corresponds to the desired geometry of the screen surface, allows simple and stable construction of the additional screening of each group. A foam material or Teflon (e.g., having a low permittivity) may be used for the support material.

Conventional coupling methods may be used to decouple adjacent conductor loops of a group. Adjacent conductor loops of a group may be decoupled capacitively and/or using an overlap. Better results have been achieved with a capacitive coupling. Capacitive decoupling may advantageously be realized by way of a capacitor provided in a shared conductor of the conductor loops.

Although instances of conductor loops, between which a further conductor loop is present in a longitudinal direction, that are already adequately decoupled by distances and geometries occur, instances where decoupling between the conductor loops separated by a conductor loop is not adequate may also occur. Additional decoupling measures, some of which may also be combined, are advantageous.

In a group including at least three conductor loops, the conductor loops (e.g., two conductor loops) separated by a conductor loop (e.g., next but one conductor loops) may be decoupled using a circuit structure. The circuit structure transmits voltage picked off at one of the two conductor loops to the other of the two conductor loops (e.g., by way of an impedance or a transformation element). The signal currently present at a conductor loop is picked off and coupled back to the next but one conductor loop but with reverse polarization. The circuit structure, in the simplest instance, may be a coaxial cable. Signals are transmitted between the next but one coils to be decoupled with the aid of the coaxial cable. To fine-tune the decoupling, an impedance element or a transformation element may be provided within the transmit coil arrangement. In all instances, therefore, the signal picked off at the one conductor loop is coupled back into the other conductor loop with phase opposition.

Alternatively, in a group including at least three conductor loops, the conductor loops (e.g., two conductor loops) separated by a conductor loop may be decoupled using a decoupling conductor that has a decoupling loop of opposite polarization in a region of the conductor loops to be decoupled. The decoupling conductor may likewise pick off a signal from a coil (e.g., inductively). The decoupling conductor forms a closed loop that has a second decoupling loop polarized with phase opposition in relation to the first decoupling loop in the other conductor loop. The second decoupling loop couples a signal received by the first decoupling loop back to the other conductor loop with phase opposition so that decoupling is permitted.

Next but one conductor loops in a group including at least three conductor loops (e.g., conductor loops separated by a conductor loop) may be decoupled using, alone or in combination with one or more of the embodiments described above, a connection including an impedance (e.g., a capacitor) between the conductor loops to be decoupled and the screen surface. This measure may be provided in addition to a signal coupling with phase opposition but may also contribute alone to the decoupling of next but one conductor loops.

In one embodiment, the screen may have a slot structure. The slot structure may be effective against fields induced by gradients. Such a procedure is already known, for example, from gradient coils. The screen surface is not entirely continuous but has slots at certain positions. The slots help prevent coupling in due to gradient flows.

In another embodiment, the transmit coil arrangement may be enclosed by a high-frequency screen fastened, for example, to a gradient arrangement. The screen surface, for example, may be electrically connected (e.g., by way of an impedance) to the high-frequency screen. If the transmit coil arrangement is integrated in a magnetic resonance device, the entire transmit coil arrangement may be enclosed by a high-frequency screen that may be fastened, for example, to a gradient coil arrangement. The screen surface, for example, may be connected electrically (e.g., by way of an impedance)

to the high-frequency screen. This further improves the screening of the groups from one another and also externally from the gradient coils, since potential differences are compensated for.

In one embodiment, a sheath of at least one coaxial cable connected to at least one conductor loop may be connected to the screen surface and/or the high-frequency screen fastened, for example, to the gradient coil arrangement. While cables may be removed for actuating the conductor loops as quickly as possible, coupling the sheath of the at least one coaxial cable to the screen surface or the high-frequency screen results in significant suppression of sheath waves so that baluns are not required or at least may be of less cumbersome dimensions.

Each conductor loop may have a tuning circuit (e.g., including a PIN diode). The tuning circuit is in principle known and advantageously allows local coils also to be used.

The present embodiments also relate to a magnetic resonance device that includes one embodiment of a transmit coil arrangement. All the embodiments relating to the transmit coil arrangement, which may therefore be provided as an integrated transmit antenna of a magnetic resonance device, may be applied analogously to the magnetic resonance device of the present embodiments, so that the advantages may also be achieved.

The magnetic resonance device, as described above, may also include a gradient coil arrangement with a high-frequency screen enclosing the transmit coil arrangement. The screen surface, for example, may be connected directly to the high-frequency screen by way of a conducting connection or using an impedance. The sheath of a coaxial cable supplying a conductor loop with signals may also be coupled, for example, to the high-frequency screen.

DETAILED DESCRIPTION OF THE DRAWINGS

Figure 1:
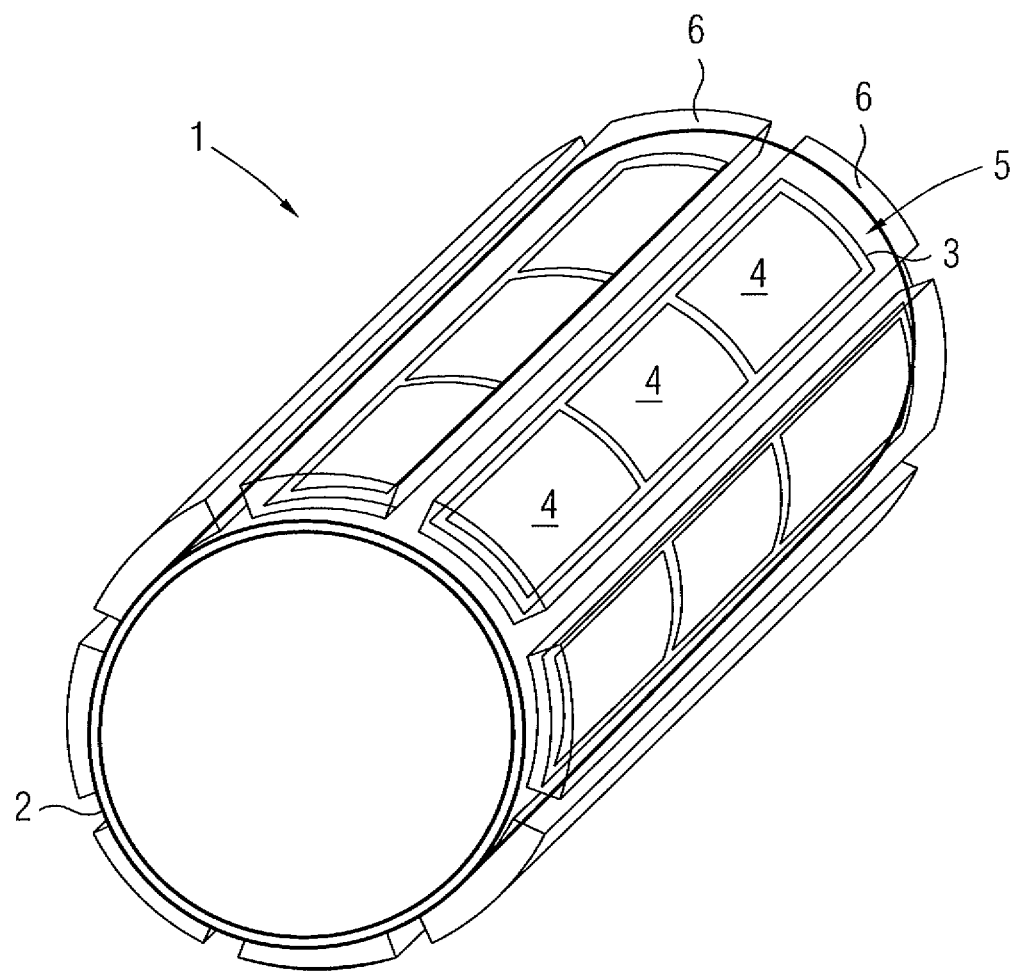
FIG. 1 shows one embodiment of a transmit coil arrangement.

FIG. 1 shows a perspective view of one embodiment of a transmit coil arrangement 1. The transmit coil arrangement 1 is to be provided for integration in a magnetic resonance facility (e.g., a magnetic resonance device). The transmit coil arrangement 1 includes a cylindrical conductor path support 2. Conductor paths 3 are positioned on the outside of the cylindrical conductor path support 2 to form conductor loops 4. In the embodiment shown in FIG. 1, the transmit coil arrangement 1 includes twenty four conductor loops 4 that are divided into eight groups 5 of three conductor loops 4. The three conductor loops 4 in each of the eight groups 5 follow one after another in a longitudinal direction. In one embodiment, the groups 5 are disposed so that the groups 5 follow one after another in an equidistant manner in a peripheral direction (e.g., at a distance of ten centimeters).

To achieve better decoupling of the conductor loops 4 of the individual groups 5, between two groups 5, the groups 5 on an outward-facing side are enclosed by a screen surface 6 formed by a copper film (shown in FIG. 1 as transparent for the sake of clarity, but is non-transparent). The screen surface 6 includes, for example, a peripheral screen wall 7 (see also FIG. 2) perpendicular to the peripheral direction. In one embodiment, the peripheral screen wall 7 has a height of around 2.5 cm. Externally (e.g., parallel to the peripheral direction), the screen surface 6 is closed by a radial portion 8, so that a pot-type structure of the screen surface 6 results. For the sake of greater clarity, the conductor paths 3 of the conductor loops 4 are not shown in the pot-type structure. The copper film 9 forming the screen surface 6, which has a thickness of 9 μm, for example, is supported by a support material 10 (e.g., Teflon with a permittivity of 2). The support material 10 may also be a foam material of low permittivity.

The support material 10 predefines the geometry of the screen surface 6. As illustrated in the embodiment shown in FIG. 1, the radial portion 8 may always be at the same distance from the conductor paths 3. The screen wall 7 rises in a perpendicular manner (e.g., in a radial direction) from the conductor path support 2.

The screen surface 6 may have a slot structure to prevent interference produced by gradient flows.

Figure 2:
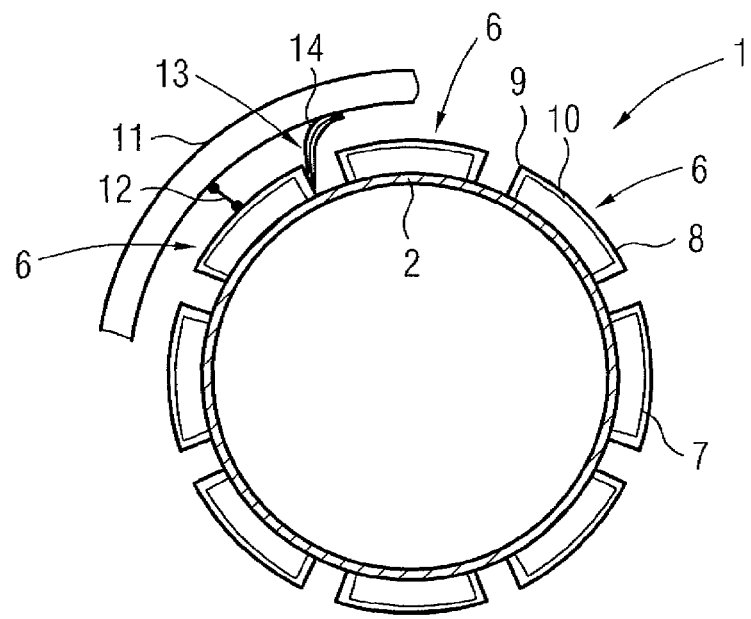
FIG. 2 shows a cross section through one embodiment of a transmit coil arrangement.

FIG. 2 shows a high-frequency screen 11 that encloses the transmit coil arrangement 1 when the transmit coil arrangement 1 is in the integrated state. The high-frequency screen 11 may be fastened, for example, to the coil arrangement 1. Only part of the high-frequency screen 11 is shown in FIG. 2, but the high-frequency screen 11 encloses the transmit coil arrangement 1 completely. Each of the screen surfaces 6 of the groups 5 is coupled by way of a conducting connection 12 to the high-frequency screen 11.

FIG. 2 also shows, by way of example, a coaxial cable 13 that is connected to a conductor loop 4. As illustrated, a sheath 14 of the coaxial cable 13 is connected both to the screen surface 6 and to the high-frequency screen 11; this allows sheath waves to be suppressed. This may apply to all coaxial cables 13, even though it is only shown by way of example for one coaxial cable 13.

In the present embodiments, the combination of a distance between the groups 5 and the screen surface 6 provides adequate decoupling of the conductor loops 4 adjacent to one another in a peripheral direction.

Figure 3:
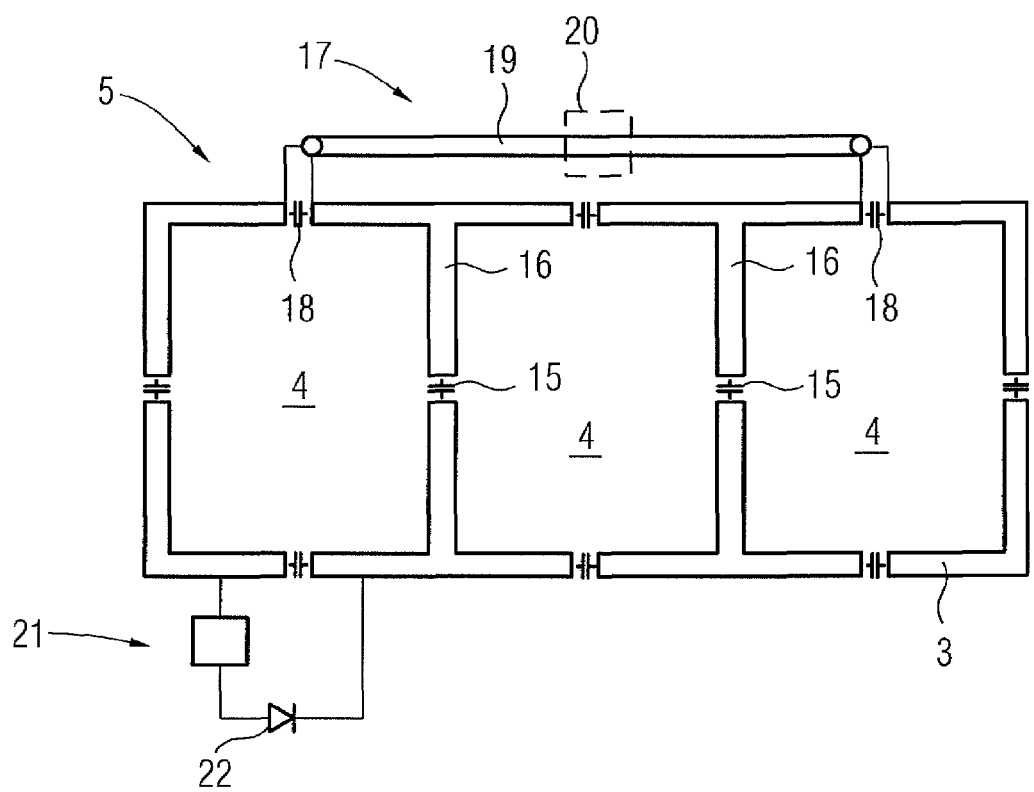
FIG. 3 shows one embodiment of a circuit within a group.

FIG. 3 shows one embodiment of a circuit of the conductor loops 4 of a group 5 formed by the conductor paths 3. The conductor loops 4 that are adjacent to one another in a longitudinal direction are decoupled using a capacitor 15. The capacitor 15 is connected in a shared conductor path 16. Adjacent conductor loops 4 may also be decoupled using an overlap but better results have been achieved for decoupling using a capacitor 15.

While it may be possible for two outer conductor loops 4, which are separated by a center conductor loop 4, to already be adequately decoupled due to a distance between one another, further decoupling measures may also be provided with respect to the two outer conductor loops 4 separated by the center conductor loop 4. FIG. 3, by way of example, shows a circuit structure 17, at which a signal of one of the two outer conductor loops 4 is picked off by way of a capacitor 18 and coupled in with phase opposition by way of a coaxial conductor 19. In one embodiment, the transmission may take place via an impedance or transformation element 20 (e.g., shown with a broken line in FIG. 3). This may be used to tune the decoupling more effectively.

FIG. 3 also shows, by way of example, a tuning circuit 21 with a PIN diode 22 on the conductor loop 4 on the far left. The tuning circuit 21 may be used to tune the conductor loop 4 when using a local coil. The tuning circuit 21 is provided on every conductor loop 4 of all the groups 5, but for the sake of clarity, the tuning circuit 21 is only shown once in FIG. 3. The tuning circuit 21 may also be present in the exemplary embodiments according to FIG. 4 and FIG. 5.

Figure 4:
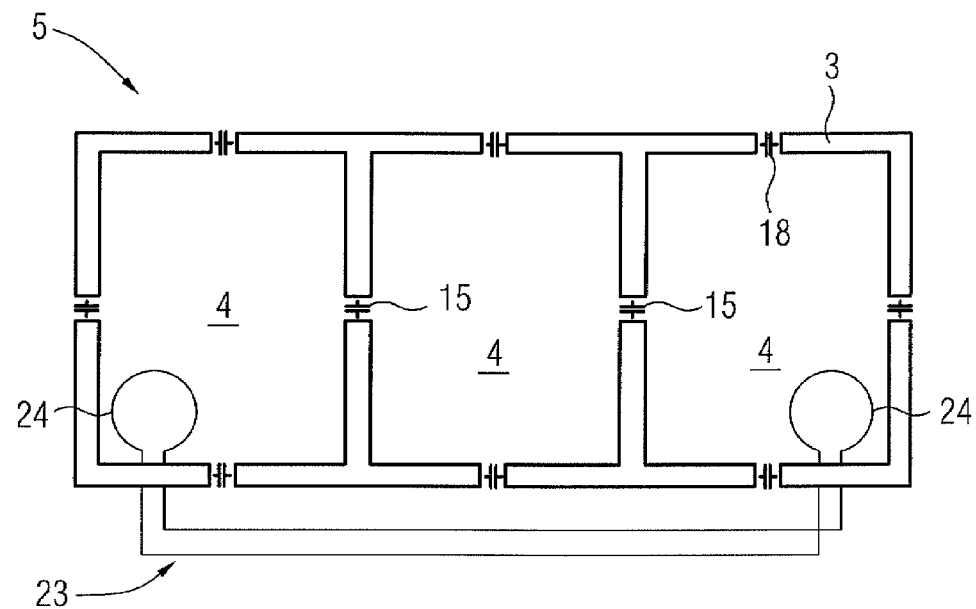
FIG. 4 shows one embodiment of a decoupling of two outer conductor loops of three conductor loops using a decoupling conductor.

FIG. 4 shows an alternative option to the one in FIG. 3 for decoupling two outer conductor loops 4. Instead of the circuit structure 17, a decoupling conductor 23 only coupled inductively to the conductor loops 4 is used. The decoupling conductor 23 defines a decoupling loop 24 in a region of each of the conductor loops 4 to be decoupled. The decoupling conductor 23 runs in an opposite direction to the conductor loops and is therefore in phase opposition. When a signal from a conductor loop 4 is received inductively by an assigned decoupling loop 24 (e.g., a first decoupling loop), the received signal is transported by way of the decoupling conductor 23 to the other conductor loop 4 and coupled in inductively at the other conductor loop 4 with phase opposition by way of a second decoupling loop 24 so that decoupling is permitted.

An impedance and/or a transformation element may also be connected in the decoupling conductor 23 for finer tuning.

The decoupling conductor 23 may, for example, be provided on a side of the conductor path support 2 opposite the conductor paths 3.

Figure 5:
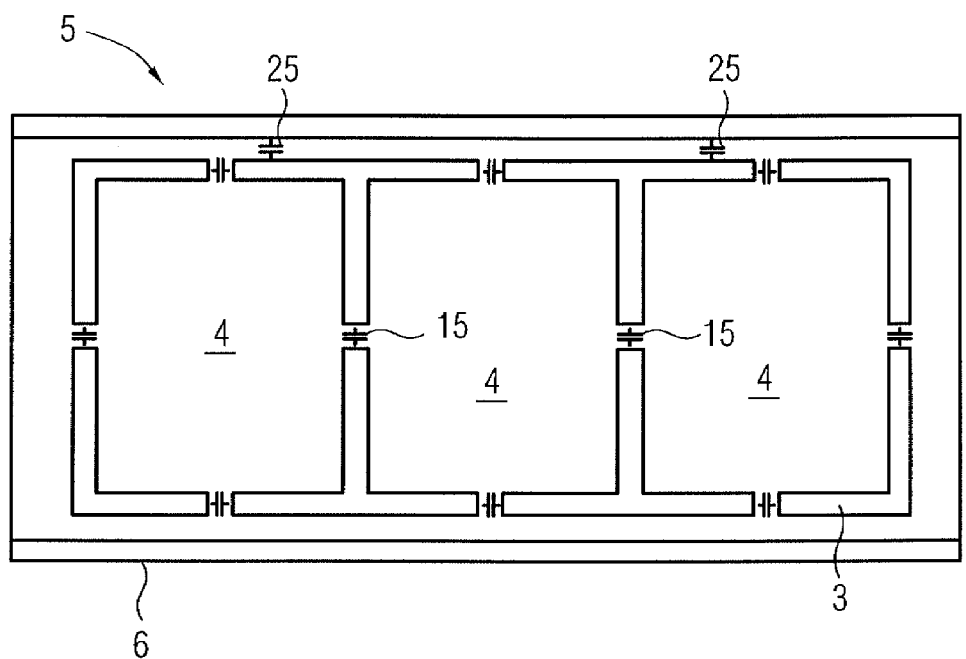
FIG. 5 shows one embodiment of a decoupling of two outer conductor loops of three conductor loops by coupling to the screen surface.

FIG. 5 shows another option for decoupling two outer conductor loops 4 of a group 5, which may also be combined with the exemplary embodiments in FIG. 3 and FIG. 4. The conductor paths 3 of the corresponding conductor loops 4 are coupled, for example, by way of a capacitor 25 to the screen surface 6 for decoupling purposes.

Figure 6:
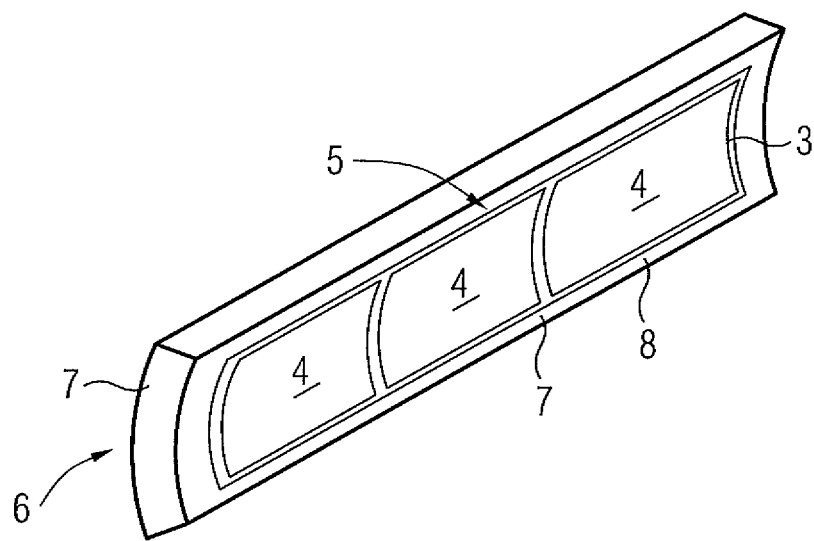
FIG. 6 shows a perspective view of one embodiment of the conductor loops of a group and the screen surface.

FIG. 6 shows a perspective view, illustrating more clearly the shape of the screen surface 6, as realized in this exemplary embodiment. For clarity, the conductor loops 4 are also shown with conductor paths 3, which are assigned to a group 5.

Figure 7:
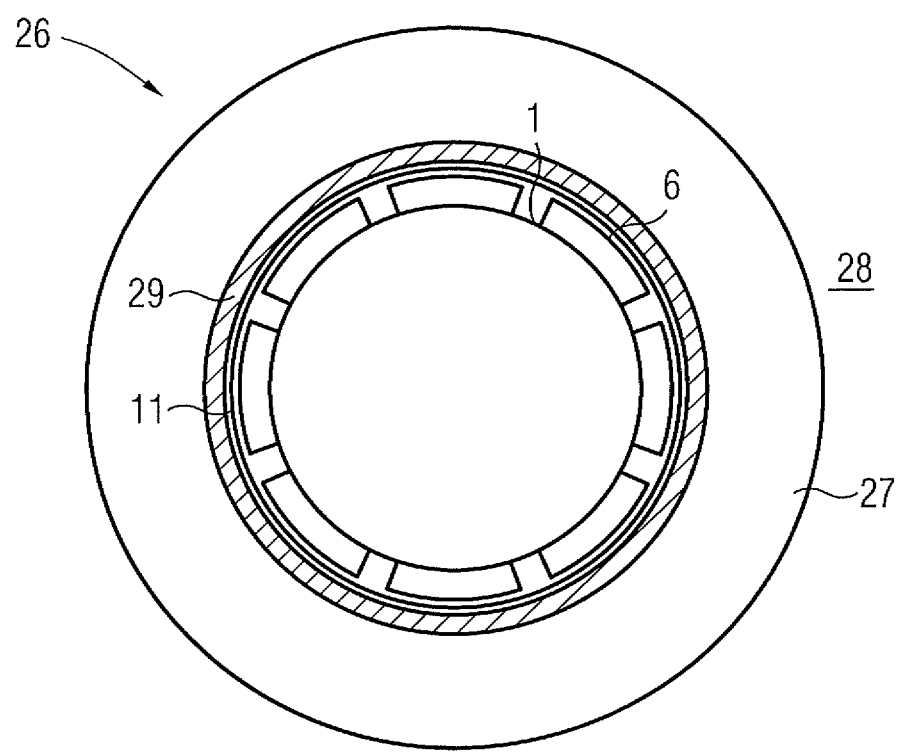
FIG. 7 shows one embodiment of a magnetic resonance device.

FIG. 7 shows a basic diagram of one embodiment of a magnetic resonance device 26. The magnetic resonance device 26 includes an essentially cylindrical basic field magnet 27 that encloses a hole 28. A gradient coil arrangement 29 is disposed in the hole 28 adjacent to the basic field magnet 27. The high-frequency screen 11 is fastened to the inside of the gradient coil arrangement 29. One embodiment of the transmit coil arrangement 1 adjoins the screen surfaces 6 on the inside a distance from the high-frequency screen 11.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A transmit coil arrangement for a magnetic resonance device, the transmit coil arrangement comprising:
a plurality of individually actuatable conductor loops following one after another in a peripheral direction and a longitudinal direction on a cylinder surface, at least two groups of at least two conductor loops of the plurality following one after the other in the longitudinal direction being provided in the peripheral direction,
wherein each group of the at least two groups is bounded at least in the peripheral direction by at least one screen surface to decouple the at least two groups.

2. The transmit coil arrangement as claimed in claim 1, wherein the at least one screen surface bounds the group in the peripheral direction and in the longitudinal direction, the at least one screen surface extending essentially perpendicular to the longitudinal direction.

3. The transmit coil arrangement as claimed in claim 1, wherein the at least one screen surface comprises a radial portion facing away from a center of the cylinder surface and distanced in a radial direction from the at least two conductor loops of the group.

4. The transmit coil arrangement as claimed in claim 1, wherein the at least one screen surface is formed by a film, has a thickness of 7 to 12 μm or is formed by the film and has a thickness of 7 to 12 μm.

5. The transmit coil arrangement as claimed in claim 1, wherein the at least one screen surface is provided on a support material that has a permittivity less than 3.

6. The transmit coil arrangement as claimed in claim 5, wherein the support material is a foam material or Teflon.

7. The transmit coil arrangement as claimed in claim 1, wherein adjacent conductor loops of the at least two conductor loops of a group of the at least two groups are decoupled capacitively, using an overlap, or capacitively and using the overlap.

8. The transmit coil arrangement as claimed in claim 1, wherein a group of the at least two groups comprises at least three conductor loops of the plurality, and
wherein conductor loops of the at least three conductor loops separated by a conductor loop of the at least three conductor loops are decoupled using a circuit structure that transmits voltage picked off at one of the conductor loops to the other of the conductor loops.

9. The transmit coil arrangement as claimed in claim 1, wherein a group of the at least two groups comprises at least three conductor loops of the plurality, and
wherein conductor loops of the at least three conductor loops separated by a conductor loop of the at least three conductor loops are decoupled using a decoupling conductor that includes a decoupling loop of opposite polarization in a region of the conductor loops to be decoupled.

10. The transmit coil arrangement as claimed in claim 1, wherein a group of the at least two groups comprises at least three conductor loops of the plurality, and
wherein conductor loops of the at least three conductor loops separated by a conductor loop of the at least three conductor loops are decoupled using a connection including an impedance between the conductor loops to be decoupled and the at least one screen surface.

11. The transmit coil arrangement as claimed in claim 1, wherein the at least one screen surface comprises a slot structure.

12. The transmit coil arrangement as claimed in claim 1, wherein the transmit coil arrangement is enclosed by a high-frequency screen fastened to a gradient coil arrangement.

13. The transmit coil arrangement as claimed in claim 12, wherein a sheath of a coaxial cable connected to at least one conductor loop of the plurality is connected to the at least one screen surface, the high-frequency screen, or the at least one screen surface and the high-frequency screen.

14. The transmit coil arrangement as claimed in claim 1, wherein each conductor loop of the plurality comprises a tuning circuit.

15. The transmit coil arrangement as claimed in claim 1, wherein the at least one screen surface extends essentially in a radial direction and the longitudinal direction.

16. The transmit coil arrangement as claimed in claim 4, wherein the film is a copper film.

17. The transmit coil arrangement as claimed in claim 8, wherein the circuit structure transmits the voltage via an impedance or a transformation element.

18. The transmit coil arrangement as claimed in claim 10, wherein the impedance comprises a capacitor.

19. The transmit coil arrangement as claimed in claim 12, wherein the at least one screen surface is electrically connected via an impedance to the high-frequency screen.

20. The transmit coil arrangement as claimed in claim 14, wherein the tuning circuit comprises a PIN diode.

21. A magnetic resonance device comprising:
a transmit coil arrangement comprising:
   a plurality of individually actuatable conductor loops following one after another in a peripheral direction and a longitudinal direction on a cylinder surface, at least two groups of at least two conductor loops of the plurality following one after the other in the longitudinal direction being provided in the peripheral direction,
wherein each group of the at least two groups is bounded at least in the peripheral direction by at least one screen surface to decouple the at least two groups.

* * * * *